(12) United States Patent
Rambosek et al.

(10) Patent No.: US 7,733,639 B2
(45) Date of Patent: Jun. 8, 2010

(54) TAMPER EVIDENT PORTABLE MEMORY HOUSING AND DEVICE

(75) Inventors: G. Phillip Rambosek, Shafer, MN (US); Gregory H. Johnson, Marine on St. Croix, MN (US)

(73) Assignee: Imation Corp., Oakdale, MN (US)

( * ) Notice: Subject to any disclaimer, the term of this patent is extended or adjusted under 35 U.S.C. 154(b) by 74 days.

(21) Appl. No.: 12/012,089

(22) Filed: Jan. 31, 2008

(65) Prior Publication Data
US 2009/0195974 A1 Aug. 6, 2009

(51) Int. Cl.
*H05K 7/12* (2006.01)
(52) U.S. Cl. .............................. 361/679.32; 361/679.56; 361/679.57; 312/223.2
(58) Field of Classification Search ............ 361/679.31, 361/679.55, 679.56; 312/223.1–223.2
See application file for complete search history.

(56) References Cited

U.S. PATENT DOCUMENTS

| | | | |
|---|---|---|---|
| 6,456,500 B1 * | 9/2002 | Chen ........................... | 361/752 |
| 6,676,419 B1 * | 1/2004 | Lin et al. .................... | 439/76.1 |
| 7,035,110 B1 * | 4/2006 | Wang et al. ................. | 361/737 |
| 7,095,617 B1 | 8/2006 | Ni | |
| 7,375,972 B2 * | 5/2008 | Kakinoki et al. ............ | 361/737 |
| 7,491,083 B2 * | 2/2009 | Shi et al. .................... | 439/358 |

\* cited by examiner

*Primary Examiner*—Jayprakash N Gandhi
*Assistant Examiner*—Ingrid Wright
(74) *Attorney, Agent, or Firm*—Shumaker & Sieffert, P.A.

(57) ABSTRACT

A portable memory housing includes a first housing section and a second housing section that couples to the first housing section to define an enclosure for portable memory components. At least one of the housing sections includes a prong extending from an edge of the housing section and an other of the housing sections defines a slot configured to receive the prong. The prong includes at least one flat that is parallel and at least one flat that is perpendicular to the edge of its respective housing section. The slot is defined by a parallel wall configured to abut the parallel flat of the prong and limit relative lateral movement of the first and second housing sections, and a perpendicular wall configured to abut the perpendicular flat of the prong to impede separation of the first housing section from the second housing section.

20 Claims, 4 Drawing Sheets

TAMPER EVIDENT PORTABLE MEMORY HOUSING AND DEVICE

BACKGROUND

Portable memory devices, such as flash memory sticks, are a popular medium for non-volatile information storage. These devices have no moving parts that could potentially fail and cause data loss, and so are ideal for providing portable memory storage. The convenience of the portable memory devices is increased by the small size of these devices making them easy for transport. The memory device itself is usually placed within a protective housing and a connector end of the memory device protrudes from the housing. The connector end is configured for insertion into laptops, desktops or other machines to access/retrieve or save data.

SUMMARY

One aspect provides a portable memory housing. The portable memory housing includes a first housing section and a second housing section that couples to the first housing section to define an enclosure for portable memory components. At least one of the first and second housing sections includes a prong extending from an edge of the housing section and an other of the first and second housing sections defines a slot configured to receive the prong. The prong includes at least one flat that is parallel and at least one flat that is perpendicular to the edge of its respective housing section. The slot is defined by a parallel wall configured to abut the parallel flat of the prong and limit relative lateral movement of the first and second housing sections, and a perpendicular wall configured to abut the perpendicular flat of the prong to impede separation of the first housing section from the second housing section.

One aspect provides a portable memory device. The portable memory device includes a memory assembly, a first housing section, and a second housing section that combine to enclose the memory assembly. The memory assembly includes a memory component and an interface port extending from the memory component. The first housing section includes a first major surface defined by a first peripheral edge and at least one prong extending from the first peripheral edge. The second housing section includes a second major surface defined by a second peripheral edge and defines at least one prong receiving slot. The first and second housing sections couple to form a tamper evident enclosure for the memory component. The prong(s) include a first flat that is parallel to the first peripheral edge and a second flat that is perpendicular to the first peripheral edge. The prong receiving slot(s) is/are defined by a wall parallel to the second peripheral edge that is configured to abut the first flat of the prong and limit relative movement of the first and second housing sections normal to the peripheral edges and a wall perpendicular to the second peripheral edge that is configured to abut the second flat of the prong and limit relative movement of the first and second housing sections normal to the first and second major surfaces.

Another aspect provides a method of providing a tamper evident enclosure for a portable memory device. The method includes providing a first section of the tamper evident enclosure including a male component and a second section of the tamper evident enclosure defining a female receptacle for the male component. The method additionally includes snapping the male component into the female receptacle, and configuring at least one of the male component and the female receptacle to plastically deform upon disengagement of the male component from the female receptacle.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a portable memory device having housing sections, with one housing section including at least one prong that is insertable into at least one corresponding slot formed on an other housing section. The prong is configured to snap-fit or interference fit into the slot and the assembly is characterized by an absence of removable fasteners. The assembled housing sections provide a tamper-evident enclosure/assembly that cannot be opened without damaging/breaking or deforming portions of the housing sections beyond their elastic limits. This joining provides for more efficient housing assembly, improved cartridge security, and tamper-evident portable memory housings.

Figure 1:
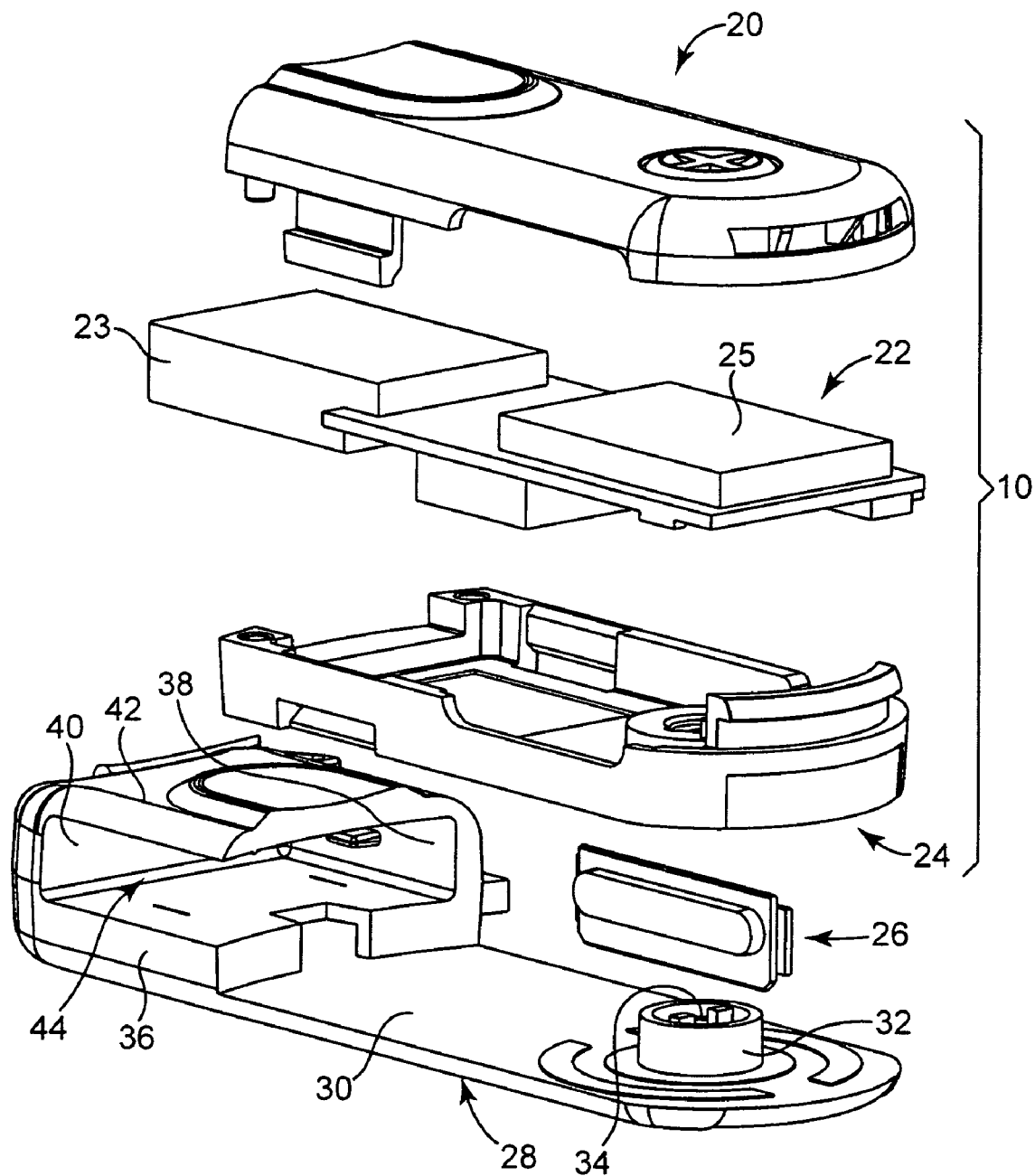
FIG. 1 is a perspective, exploded view of a portable memory device including first and second housing sections according to one embodiment.

FIG. 1 is an exploded, perspective view of a portable memory device 10 according to one embodiment. The portable memory device 10 includes a first housing section 20 and a second housing section 24 that combine to define an enclosure for a memory assembly 22. The memory assembly 22 includes a data port 23 extending from the memory assembly 22 and a memory component 25. One suitable data port 23 includes a universal serial bus (USB) connector, although other suitable data ports 23 would be apparent to one of ordinary skill in the art. One suitable memory component 25 includes a flash memory, although other suitable memory components would be apparent to one of ordinary skill in the art.

In one embodiment, the portable memory device 10 optionally includes a light emitting diode (LED) 26 and a cover member 28. The LED 26 is configured to indicate an operational status of the memory component 25 to a user, for example, becoming lighted to indicate access to the memory. The cover member 28 defines a major surface 30, a boss 32 extending away from the major surface 30, and a platform 36. In one embodiment, the boss 32 defines a well 34 that is configured to receive a pin employed to attach the cover member 28 to the housing sections 20 and 24 as described below.

In one embodiment, the platform 36 is provided with side walls 38 and 40 and a surface 42 connected to the side walls 38 and 40 above the platform 36. The platform 36, side walls 38 and 40, and surface 42 define a cavity 44 that is sized to cover the data port 23 of the memory assembly 22. The cover member 28 is attachable to the portable memory device 10 via the boss 32 and is rotatable in a manner that provides selective access to the data port 23.

Figure 2:
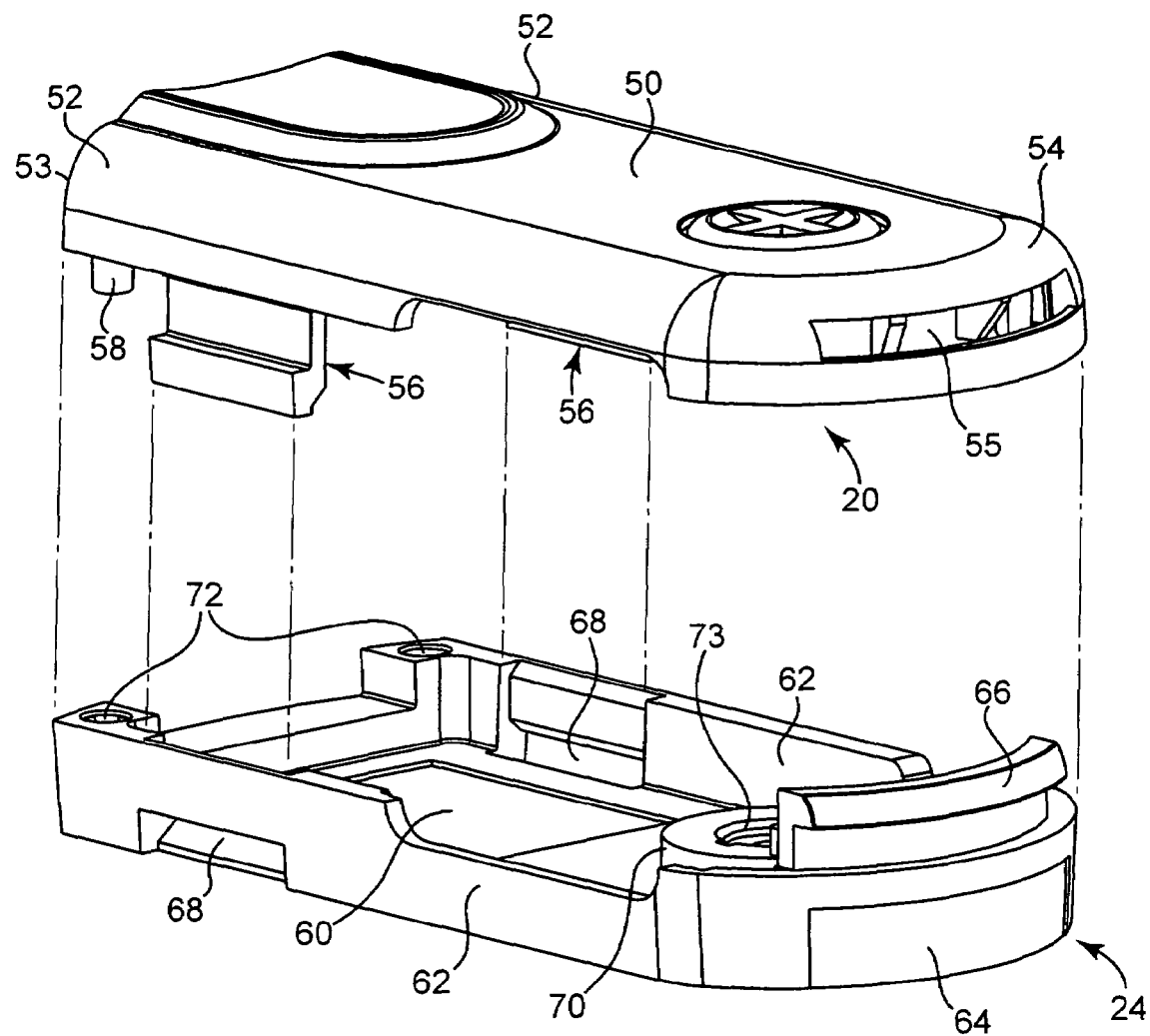
FIG. 2 is a perspective, exploded view of the first and second housing sections shown in FIG. 1.

FIG. 2 is a perspective, exploded view of the first and second housing sections 20 and 24. The first housing section 20 includes a major surface 50 defined by sidewalls 52 and an end wall 54 that defines a slot 55. In one embodiment, the end wall 54 is curved, and the curved end wall 54 defines a curved slot 55. In some embodiments, the curved slot 55 is formed by the curved end wall 54 and the major surface 50.

In one embodiment, the first housing section 20 includes at least one prong 56 that extends from sidewalls 52. In the illustrated embodiment, the first housing section 20 includes two prongs 56 extending from sidewalls 52. In one embodiment, the prongs 56 extend normal relative to the major surface 50, although other orientations for prongs 56 relative to the major surface 50 are also acceptable.

In one embodiment, the first housing section 20 includes one or more pins 58 that are provided adjacent to an end 53 of the first housing section 20 and configured to align the first housing section 20 with the second housing section 24. The alignment pins 58 extend from the major surface 50, although one of skill in the art will recognize that other such structures and their locations are also acceptable.

The second housing section 24 includes a major surface 60 defined by sidewalls 62 and an end wall 64. In one embodiment, the end wall 64 is radially curved as illustrated and includes a complementary and similarly radially curved prong 66. The curved prong 66 extends from the curved end wall 64 and is configured to interact with the curved slot 55 of the first housing section.

In one embodiment, the side walls 62 form one or more slots 68 that are configured to receive the prongs 56. In some embodiments, the slots 68 are formed in the major surface 60 or in a combination of the major surface 60 and the side walls 62. In one embodiment, the side walls 62 form wells 72 that are configured to accept the pins 58 of the first housing section 20. In some embodiments, the wells 72 are separate from the side walls 62 or are formed on different parts of the second housing section 24. Extending from the major surface 60 is a boss 70 that defines a well 73. The boss 70 and well 73 are configured to interact with the cover member 28 (FIG. 1), and are likewise optional to the extent that the cover member 28 is optional.

Figures 3A, 3B:
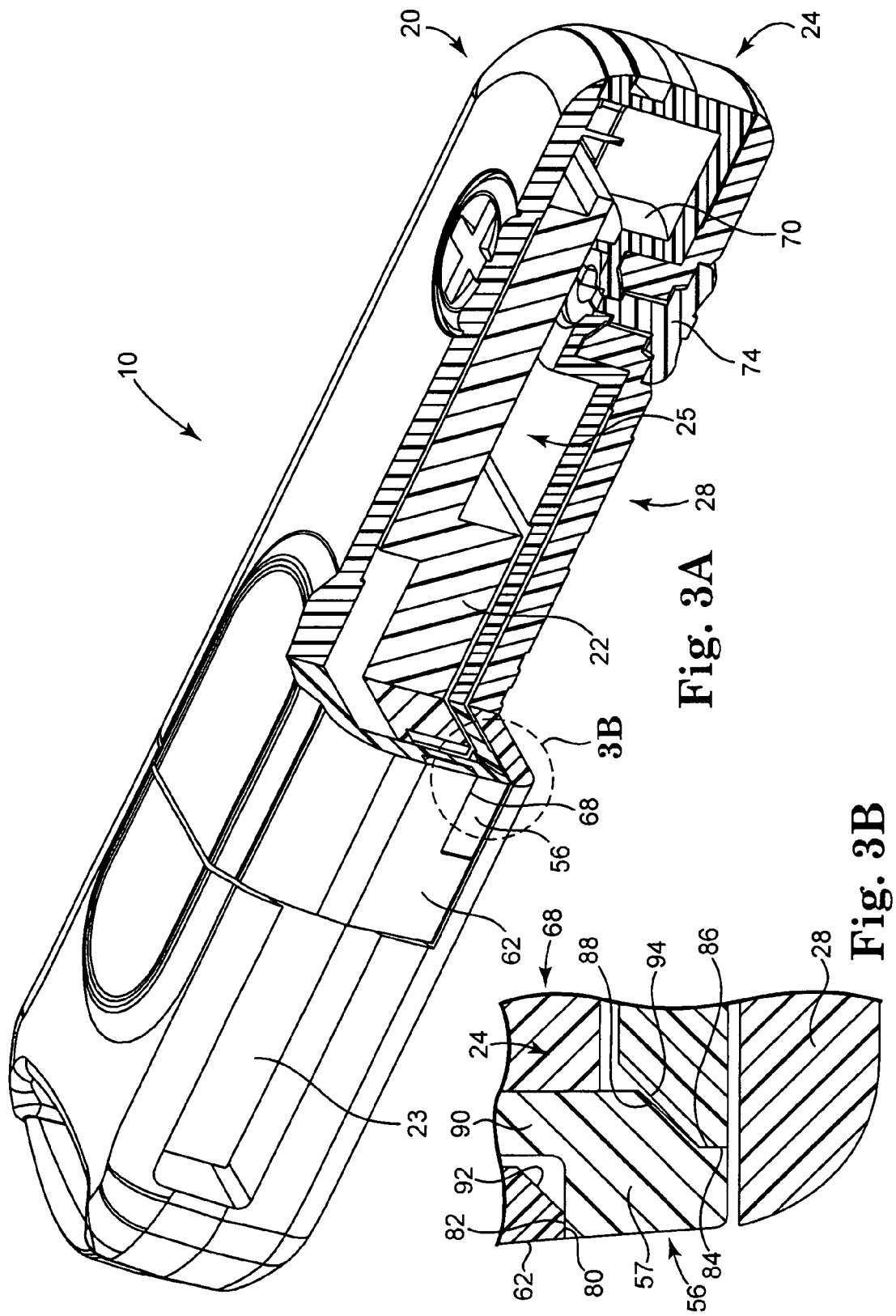
FIG. 3A is a partial sectional view of the first housing section assembled to the second housing section to define an enclosure for a memory assembly of the portable memory device according to one embodiment.
FIG. 3B is an enlarged cross-sectional view of a prong of the first housing section coupled into a slot of the second housing section according to one embodiment.

FIG. 3A is a partial sectional view of a first housing section 20 assembled to a second housing section 24 to define an enclosure 25 for the memory assembly 22 of the portable memory device 10 according to one embodiment. The pins 58 are aligned with and inserted into the wells 72, and the prongs 56 and 66 have been inserted into the respective slots 68 and 55 to provide a tamper evident housing 10 that encloses the memory assembly 22. The optional cover member 28 is coupled to the second housing section 24 by way of the boss 32 being inserted into the well 73. The cover member 28 is held in place by a pin 74 that is inserted through the well 34 of the boss 32 of the cover member 28 and into the well 73 of the boss 70 of the second housing section 24. Alternative embodiments of joining the cover member 28 to the housing sections 20 and 24 would be apparent to one of ordinary skill in the art.

FIG. 3B is an enlarged cross-sectional view of a prong 56 of the first housing section 20 coupled into a slot 68 of the second housing section 24 shown in FIG. 3A. FIG. 3B is equally applicable to curved prong 66 and the curved slot 55. The prong 56 includes a stem 90 and a prong head 57 extending from the stem 90. The prong head 57 includes a perpendicular flat 80 and a parallel flat 84 in relation to the side wall 62.

The slot 68 forms a complementary perpendicular wall 82 and a complementary parallel wall 86. This configuration allows for the slots 68 to hold the prongs 56 in place when force is applied to the prongs 56. The prong head 57 includes an angled flat 88 extending between the parallel flat 84 and the stem 90. The perpendicular flat 80 is connected to and extends from the stem 90 of the prong 56. In one embodiment, the perpendicular flat 80 and the stem 90 of the prong 56 are at about a 90 degree angle to one another.

The slot 68 has an angled flat 92 that extends between the perpendicular wall 82 and the peripheral edge 62 of the housing section 24. The slot further includes another angled flat 94 extending from the parallel wall 86. These angled flats 92 and 94 of the slot 68 are configured to allow for the prong head 57 to be pushed into the slot 68 in an interference-fit or snap-fit manner. It has been surprisingly found that this configuration prevents the separation of the housing sections 20 and 24 without evident damage to one or both of the housing sections 20, 24. Alternative embodiments that provide for orientations of the flats found on both the prong head 57 and slot 68 that are configured to provide a flat resisting surface in the direction that a force is applied will be apparent to one of ordinary skill in the art.

In one embodiment, the prongs 56, 66 define male members that are interference-fit into the respective slots 68, 55, which define female receptacles. Once the male members 56, 66 are fit into the female receptacles 68, 55, the housing sections 20, 24 are durably coupled together and cannot be separated without damaging or deforming one or both of the housing sections 20, 24.

The housing sections 20, 24 are formed from materials that are selected to fracture or plastically deform beyond the elastic limits of the material. For example, at least the prongs 56 of the first housing section 20 are fabricated from material that characteristically includes an abrupt maximum in its stress-strain curve such that the material plastically fractures abruptly rather than elastically deforming when stressed. The plastic fracture provides a visually evident deformation of the housing components that enables a tamper evident feature of the housing 10. Suitable materials for the housing sections 20 and 24 include polycarbonates, acrylonitrile butadiene styrene, medium-impact polystyrene, high-impact polystyrene, or other materials that plastically fracture when stressed by an amount that one would employ when attempting to separate the housing sections 20, 24. While not bound to this theory, it is believed that these crystalline plastics are preferred over amorphous plastics because they fracture more abruptly when stressed, thus making these plastics more suitably tamper evident. Attempts to push or dislodge the prongs 56 and 66 from the slots 68 and 55 will be tamper evident because the breakage or plastic deformation of the housings sections, prongs, or slots will be visually evident. Additional materials that provide the desired characteristics will be apparent to one of ordinary skill in the art.

Figure 4:
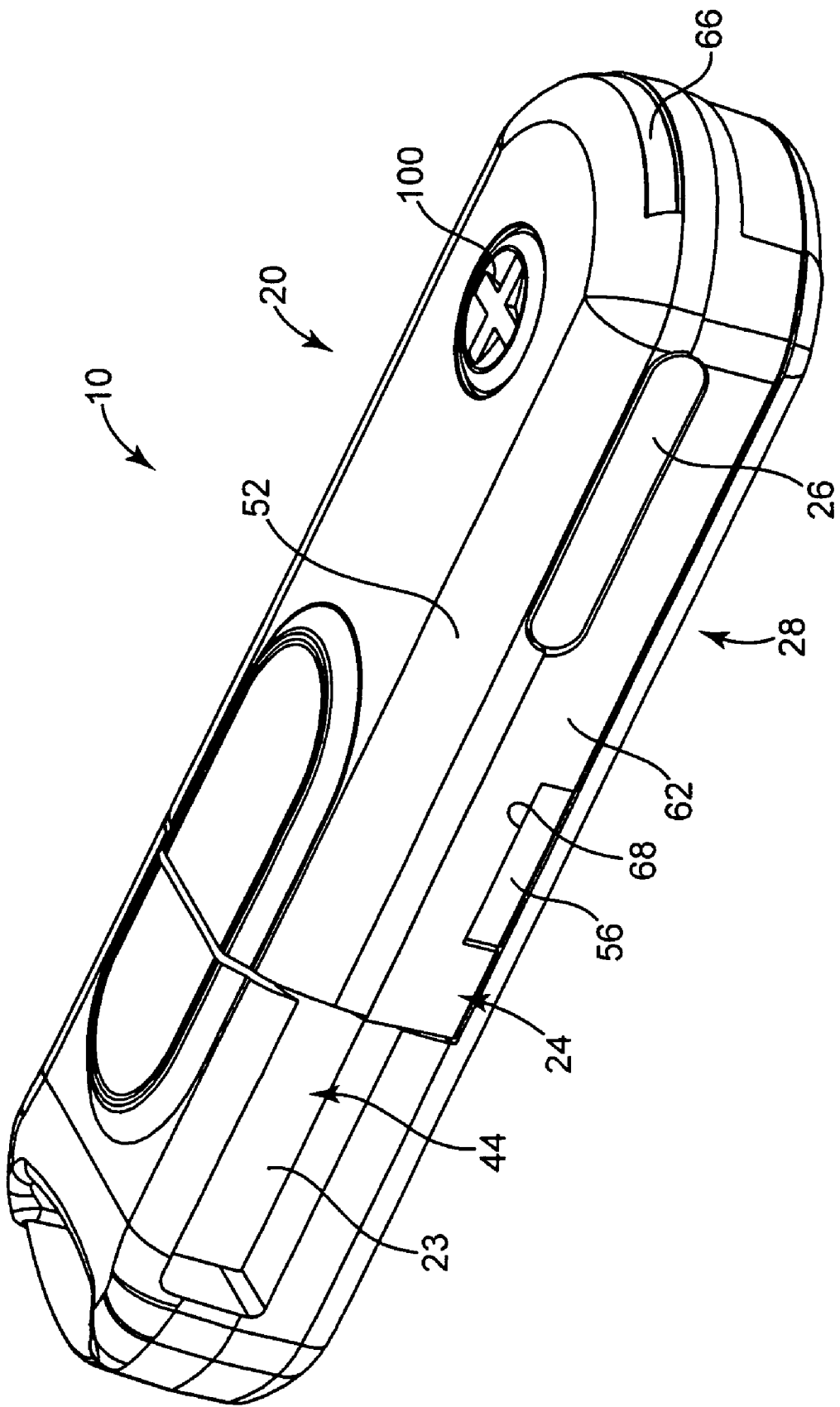
FIG. 4 is a perspective view of an assembled tamper evident portable memory housing enclosing a memory device according to one embodiment.

FIG. 4 is a perspective of an assembled portable memory device 10 according to one embodiment. The housing sections 20 and 24 are joined and encase the memory assembly 22 (not visible), and the data port 23 is protectively disposed within the cavity 44 formed by the cover member 28. The LED 26 is captured between the side walls 52 and 62. The first housing section 20 includes molded indicia 100 found on the major surface 50. In other embodiments the cover member or either of the housing sections is marked or molded with other indicia.

When assembled, the prongs 56 fit into the slots 68 such that the parallel wall 86 abuts the parallel flat 84 of the prong 56 and limits relative lateral movement of the first and second housing sections 20, 24, and the perpendicular wall 82 abuts the perpendicular flat 80 of the prong 56 to impede separation of the first housing section 20 from the second housing section 24. Attempts to separate the housing sections 20, 24 results in one or both housing sections 20, 24 (e.g., prong 56 or slot 68) deforming beyond an elastic limit of the material employed to form these components, such that one or both housing sections 20, 24 is damaged in a visually evident manner.

Assembly of the tamper evident memory housing involves the steps of providing a second housing section 24 and a memory assembly 22, placing the memory assembly 22 inside the second housing section 24 with the data port placed away from the curved side wall 64, and placing the LED 26 in the side wall 62 of the second housing section 24 and covering the memory assembly 22 with the first housing section 20. The appropriate prongs 56 and 66 need to be aligned with the appropriate slots 68 and 55. In addition, the pins 58 need to be aligned with the wells 72. Pressing the prongs 56 and 66 into the slots 68 and 55 until the flats 80 and 84 are in parallel contact with the corresponding walls 82 and 86 and the pins 58 are within the wells 72. The next step is to insert the boss 32 of the cover member 28 into the well 73 of the boss 70 of the second housing section 24. Once the boss 32 is within the well 73, the pin 74 is placed into the well 34 of the cover member 28 until it interlocks with the well 73 of the second housing section 24.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the tamper evident housings for portable memory devices discussed herein. Therefore, it is intended that this invention be limited only by the claims and the equivalents thereof.

What is claimed is:

1. A portable memory housing comprising:
a first housing section defining opposed outer side walls and a second housing section walls defining opposed outer side walls and coupleable to the first housing section to define an enclosure for portable memory components, at least one of the first and second housing sections including a prong extending from an edge of the housing sections and an other of the first and second housing sections defining a slot configured to receive the prong, the prong having a prong head defining a surface substantially aligned with at least one of the opposed outer side walls;
wherein the prong comprises at least one flat that is parallel and at least one flat that is perpendicular to the edge of its respective housing section, and the slot is defined by a parallel wall configured to abut the parallel flat of the prong and limit relative lateral movement of the first and second housing sections and a perpendicular wall configured to abut the perpendicular flat of the prong to impede separation of the first housing section from the second housing section.

2. The portable memory housing of claim 1, wherein the first housing section comprises an upper housing section including at least two prongs and the second housing section comprises a lower housing section that defines at least two slats, each slot configured to receive a respective one of the prongs.

3. The portable memory housing of claim 1, wherein the edge of the second housing section comprises a radially curved end, the radially curved end of the second housing section including a radially curved prong.

4. The portable memory housing of claim 2, wherein the at least two slots comprise at least two substantially linear slots.

5. The portable memory housing of claim 3, wherein the first housing section includes at least one radially curved slot that is configured to receive the radially curved prong.

6. The portable memory housing of claim 1, wherein the first housing section includes at least one pin and the second housing section includes at least one well configured to interface with the at least one pin of the first housing section.

7. The portable memory housing of claim 1, wherein the second housing section includes a boss, the boss includes at least one pin projecting from the boss.

8. A portable memory device comprising:
a memory assembly including a memory component and an interface port extending from the memory component,
a first housing section comprising a first major surface defined by a first peripheral edge and including at least one prong extending from the first peripheral edge; and
a second housing section comprising a second major surface defined by a second peripheral edge and defining at least one prong receiving slot, the first and second housing sections coupled to form a tamper evident enclosure for the memory component;
a cover to one of the first and second housing sections and configured to rotate with respect to the first and second housing sections to
wherein the at least one prong comprises a first flat that is parallel to the first peripheral edge and a second flat that is perpendicular to the first peripheral edge, and the at least one prong receiving slot is defined by a wall parallel to the second peripheral edge that is configured to abut the first flat of the prong and limit relative movement of the first and second housing sections normal to the peripheral edges and a wall perpendicular to the second peripheral edge that is configured to abut the second flat of the prong and limit relative movement of the first and second housing sections normal to the first and second major surfaces.

9. The portable memory device of claim 8, wherein the at least one prong extends perpendicularly relative to the first major surface.

10. The portable memory device of claim 8, wherein the first housing section includes two orthogonally linear prongs and a radially curved prong receiving slot.

11. The portable memory device of claim 10, wherein the second housing section includes one radially curved prong and two orthogonally linear prong receiving slots.

12. The portable memory device of claim 8, wherein the parallel wall of the at least one prong receiving slot is formed by the second major surface and the perpendicular wall of the at least one prong receiving slot is formed by the second peripheral edge.

13. The portable memory device of claim 8, wherein the cover member rotates about an axis passing through the memory component.

14. A method of providing a tamper evident enclosure for a portable memory device, the method comprising:
   providing a first section of the tamper evident enclosure comprising a male component and a second section of the tamper evident enclosure defining a female receptacle for the male component;
   snapping the male component into the female receptacle such that an outer surface of the male component is exteriorly exposed upon final assembly of the tamper evident enclosure; and
   configuring at least one of the male component and the female receptacle to plastically deform upon disengagement of the male component from the female receptacle.

15. The method of claim 14, further comprising a second male component and a second female component, wherein snapping the male component into the female receptacle comprises:
   snapping each of the two male components of the first section of the tamper evident enclosure into each of the two respective female receptacles formed by the second section of the tamper evident enclosure; and
   limiting relative motion between the first and second sections of the tamper evident enclosure.

16. The method of claim 15, wherein snapping each of the two male components of the first section of the tamper evident enclosure into each of the two respective female receptacles formed by the second section of the tamper evident enclosure comprises wedging surfaces of the two male components against complementary surfaces of the two respective female receptacles.

17. The method of claim 16, wherein wedging surfaces of the two male components against complementary surfaces of the two respective female receptacles comprises fitting the two male components into the two respective female receptacles in a manner that negates removal without damaging one or both of the male components and one or both of the female receptacles.

18. The method of claim 14, wherein configuring at least one of the male component and the female receptacle to plastically deform upon disengagement of the male component from the female receptacle includes abutting a parallel flat of the male component against a complementary parallel wall of the female receptacle to prevent lateral movement.

19. The method of claim 14, wherein configuring at least one of the male component and the female receptacle to plastically deform upon disengagement of the male component from the female receptacle includes abutting a perpendicular flat of the male component against a complementary perpendicular wall of the female receptacle to prevent separation of the first and second sections.

20. The method of claim 14, wherein snapping the male component into the female receptacle comprises:
   abutting a first flat of the male component against a complementary parallel flat of the female receptacle;
   limiting relative movement of the first and second sections normal to a peripheral edge of the tamper evident enclosure;
   abutting a second flat of the male component against a complementary perpendicular flat of the female receptacle; and
   limiting relative movement of the first and second sections parallel to the peripheral edge of the tamper evident enclosure.

* * * * *

UNITED STATES PATENT AND TRADEMARK OFFICE
CERTIFICATE OF CORRECTION

PATENT NO. : 7,733,639 B2  Page 1 of 1
APPLICATION NO. : 12/012089
DATED : June 8, 2010
INVENTOR(S) : G. Phillip Rambosek et al.

It is certified that error appears in the above-identified patent and that said Letters Patent is hereby corrected as shown below:

Column 6
   Line 4, "walls" should be removed.
   Line 8, "the" should read --its--.
   Line 9, "sections" should read --section--.
   Line 27, "slats" should read --slots--.
   Line 57, "a cover to one" should read --a cover member coupleable to one--.
   Line 59, "sections to" should read --sections to selectively access and cover the interface port--.

Signed and Sealed this
Third Day of May, 2011

David J. Kappos
*Director of the United States Patent and Trademark Office*